United States Patent
Appelt et al.

(10) Patent No.: US 6,739,046 B1
(45) Date of Patent: May 25, 2004

(54) METHOD FOR PRODUCING DENDRITE INTERCONNECT FOR PLANARIZATION

(75) Inventors: Bernd K. Appelt, Brackney, PA (US); Saswati Datta, Cincinnati, OH (US); Michael A. Gaynes, Vestal, NY (US); John M. Lauffer, Waverly, NY (US); James R. Wilcox, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/576,641

(22) Filed: May 22, 2000

Related U.S. Application Data

(63) Continuation of application No. 08/918,085, filed on Aug. 25, 1997, now Pat. No. 5,977,642.

(51) Int. Cl.⁷ .............................. H05K 3/02; H05K 3/10
(52) U.S. Cl. .............................. 29/846; 29/830; 29/832; 174/250; 174/255; 174/258
(58) Field of Search .................... 29/830, 846, 825, 29/832; 174/250, 255, 256, 257, 258

(56) References Cited

U.S. PATENT DOCUMENTS

| | | | |
|---|---|---|---|
| 3,359,145 A | 12/1967 | Salyer et al. ................... 156/1 |
| 4,151,543 A | 4/1979 | Hayakawa et al. ............ 357/65 |
| 4,157,932 A | 6/1979 | Hirata ......................... 156/310 |
| 4,704,367 A | 11/1987 | Alvis et al. ..................... 437/24 |
| 4,922,320 A | 5/1990 | McDavid et al. ............. 357/67 |
| 4,937,653 A | 6/1990 | Blonder et al. ................ 357/68 |
| 5,019,944 A | * 5/1991 | Ishii et al. .................... 361/783 |
| 5,137,461 A | 8/1992 | Bindra et al. ................. 439/74 |
| 5,214,307 A | 5/1993 | Davis .......................... 257/676 |
| 5,298,685 A | 3/1994 | Bindra et al. ................ 174/250 |
| 5,371,654 A | 12/1994 | Beaman et al. ............. 361/744 |
| 5,435,057 A | * 7/1995 | Bindra et al. ................ 174/255 |
| 5,509,200 A | 4/1996 | Frankeny et al. ............. 29/852 |
| 5,600,103 A | 2/1997 | Odaira et al. ............... 174/265 |
| 5,745,333 A | 4/1998 | Frankeny et al. ........... 361/313 |
| 5,759,047 A | 6/1998 | Brodsky et al. .............. 439/66 |
| 6,239,386 B1 | * 5/2001 | DiStefano et al. .......... 174/262 |
| 6,326,561 B1 | * 12/2001 | Watanabe et al. ........... 174/260 |

FOREIGN PATENT DOCUMENTS

GB          1568464        4/1978

OTHER PUBLICATIONS

IBM Technical Disclosure Bulletin vol. 32, No. 10B, entitled "Direct Chip Bonding Using Transferred Conductive Adhesive Film", pp. 474–475, Mar., 1990.

* cited by examiner

Primary Examiner—Rick Kiltae Chang
(74) Attorney, Agent, or Firm—James A. Lucas; Driggs, Lucas, Brubaker & Hogg Co., LPA

(57) ABSTRACT

A method is provided for connecting two conductive surfaces in an electronic circuit package comprising the steps of forming dendrites on selected regions of a first conductive surface, applying a dielectric insulation material over the first conductive surface such that the dendrites are exposed through the insulation material to leave a substantially planar surface of exposed dendrites, and placing a second conductive surface on top of the exposed dendrites. The second conductive surface may be a surface metal, a chip bump array, or a ball grid array. Also claimed is an electronic circuit package incorporating the dendrites used for electrical interconnection and planarization manufactured in accordance with the present invention.

29 Claims, 2 Drawing Sheets

METHOD FOR PRODUCING DENDRITE INTERCONNECT FOR PLANARIZATION

RELATED APPLICATIONS

Application is a continuation Ser. No. 08/918,085, filed Aug. 25, 1997, for "Dendrite Interconnect for Planarization and Method for Producing Same"—Now U.S. Pat. No. 5,977,642, issued Nov. 2, 1999.

TECHNICAL FIELD OF THE INVENTION

The present invention relates to electronic circuit packages with dendrites connecting two conductive surfaces and method for producing same. The dendrites electrically connect the two conductive surfaces and provide coplanarity such that planarization process steps can be eliminated.

BACKGROUND OF THE INVENTION

Electronic circuits contain many (sometimes millions) of components such as resistors, capacitors, inductors, diodes, electromechanical switches, and transistors. High density packaging of electronic components is particularly important to allow fast access to large amounts of data in computers. High density electronic circuit packages also are important in high frequency devices and communications devices. The components are connected to form circuits and circuits are connected to form functioning devices. The connections perform power and signal distribution. In a multi-layer electronic circuit package, some layers of the package serve as power planes and other layers serve as signal planes, depending on the operational requirements of the device. The devices require mechanical support and structural protection. The circuits themselves require electrical energy to function. The functioning devices, however, produce heat, or thermal energy which must be dissipated so that the devices do not stop functioning. Moreover, while high density packaging of a number of components can improve performance of the device, the heat produced by the power-consuming components can be such that performance and reliability of the devices is adversely impacted. The adverse impact arises from electrical problems such as increased resistivity and mechanical problems such as thermal stress caused by increased heat.

Electronic circuit packages, such as chips, modules, circuit cards, circuit boards, and combinations of these, thus must meet a number of requirements for optimum performance. The package must be structurally sturdy enough to support and protect the components and the wiring. In addition, the package must be capable of dissipating heat and must have a coefficient of thermal expansion that is compatible with that of the components. Finally, to be commercially useful, the package should be inexpensive to produce and easy to manufacture.

High density packages necessarily involve increased wiring density and thinner dielectric coatings between layers in a multi-layer electronic circuit package. The layers in a multi-layer package typically are electrically connected by vias and through-holes. The term "via" is used for a conductive pathway between adjacent layers in a multi-layer electronic circuit package. The term "through-hole" is used for a conductive pathway that extends to a non-adjacent layer. For high density packages the through-holes are increasingly narrow in diameter and the through-holes in each layer must be aligned precisely. This invention provides an alternative means of interconnection—namely electrical interconnection using dendrites.

Furthermore, in creating a multi-layer electronic circuit package, particularly an organic package, metal circuits on the surface contribute to non-planar surfaces in the manufacturing process. To solve the problem of non-planar surfaces, many techniques of planarization are known in the art. However, these techniques require added processing steps. An object of this invention is to provide "automatic" planarization by means of dendrites used for interconnection between conductive layers of the electronic circuit package such that the need for additional planarization steps in the manufacturing process is eliminated.

SUMMARY OF THE INVENTION

It is an object of this invention to provide an electronic circuit package with dendrites forming electrical connections between a first conductive layer and second conductive layer.

A further object of this invention is to provide an electronic circuit package that is inherently planarized using dendrites, thereby eliminating the need for planarization steps in the manufacturing process of the electronic circuit package.

A third object of this invention is to provide methods of fabrication of electronic circuit packages with dendrites forming electrical connections between a first conductive layer and a second conductive layer.

A fourth object of this invention is to provide an electronic circuit package and method for producing said package with dendrites forming electrical connections between a first conductive layer and a second conductive layer that is a ball grid array.

Accordingly, a method is provided for connecting two conductive layers in an electronic circuit package comprising the steps of forming dendrites on selected regions of a first conductive layer, applying an insulation material over the first conductive layer such that the dendrites are exposed through the insulation material to leave a substantially planar surface of exposed dendrites, and placing a second conductive layer on top of the exposed dendrites. Also claimed is an electronic circuit package incorporating the dendrites used for electrical interconnection and planarization manufactured in accordance with the present invention.

It is an advantage of the present invention that the dendrites provide electrical connection between two conductive layers of the electronic circuit package.

It is a further advantage that the dendrites provide a substantially planar surface for attachment of the second conductive layer without the need for additional planarization steps in the process of manufacturing the electronic circuit package.

Other features and advantages of the present invention will become apparent in the following detailed description of the preferred embodiment of the invention taken in conjunction with the accompanying drawings and examples.

DETAILED DESCRIPTION OF THE INVENTION

The present invention is of an electronic circuit package using dendrites to provide connection between two conductive circuits and using dendrites for the added advantage of inherent planarization such that planarization steps can be removed from the manufacturing process. The invention can best be understood by reference to the drawings.

Figure 1:
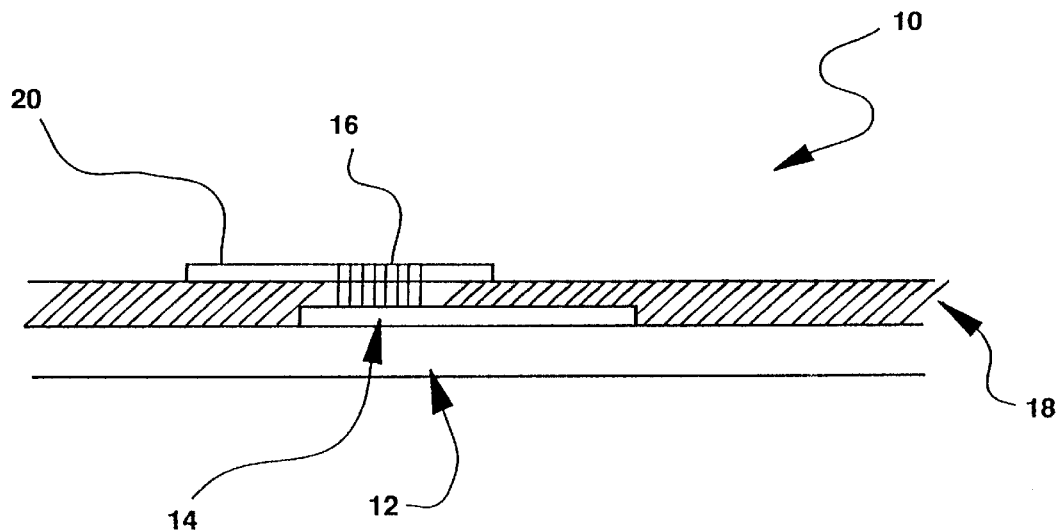
FIG. 1 is a depiction of a single layer of a multi-layer electronic circuit package using dendrites for electrical connections and planarization, in accordance with the present invention.

FIG. 1 illustrates a sample layer 10 of an electronic circuit package in accordance with the present invention. Referring to FIG. 1, at the bottom of the layer 10 is a substrate 12 such as a PCB-core or subcomposite. The substrate 12 is preferably an organic substance such as epoxy/glass, bismaleimide triazine, cyanate ester, polyimide or PTFE. A first surface metal 14 is situated on top of the substrate 12 and covers some portion of the upper surface of substrate 12. The first surface metal 14 is used for circuit wires or vias (not shown) that protrude approximately 1 mil above the surface. The first surface metal 14 forms a first conductive surface. In the preferred embodiment of the invention, the first surface metal 14 is of a copper material, typically 0.5–1.4 mils thick. Other suitable materials for the first surface metal 14 include, but are not limited to, copper with nickel or nickel and gold overplate, as well as copper over nickel or chrome.

Dendrites 16 are applied at selected locations on the surface metal 14. The dendrites 16 preferably are made of palladium metal. Palladium metal possesses desired mechanical and physical properties. Other suitable metals for the dendrites include, but are not limited to, nickel, copper, platinum, or tungsten.

The dendrites may be formed by a variety of methods. One such method is to apply a photoresist material to the area of surface metal 14 and then expose and develop the resist (not shown) by photolithographic techniques to provide an exposed area on which the dendrites are to be formed.

Typical photoresist materials are methacrylate polymeric resist compositions and electrophoretic resists such as those obtainable from Shipley or Nippon Paint.

According to a preferred method, an intermediate layer of nickel (not shown) is electroplated onto the first surface metal 14 followed by an intermediate layer of palladium, after applying resist material.

The nickel layer is typically about 1 to about 2.5 microns and more typically about 2 microns thick. The nickel covers the first surface metal 14 to prevent it from contaminating the palladium plating composition.

In addition this intermediate layer of palladium is typically about 1 to about 2.5 microns and more typically about 2 microns thick. Typical compositions and parameters for electroplating these layers of palladium are 100 millimolar solution of palladium and 10 mA/sq.cm.

The dendrites 16 then are formed on the intermediate palladium layer by any known technique such as by ultrasonic plating of palladium typically at about 80 to 100 milliamps/cm$^2$ of surface area of first surface metal 14. Typical palladium compositions are 150 millimolar palladium tetramaine-chloride at ph 9 and a current density of 5 mA/cm$^2$ for about 30 minutes followed by pulse plating at 800 mA/cm$^2$ peak current at a 10% duty cycle of 1 millisecond pulse on time, 9 millisecond pulse off time in a solution of 15 millimolar palladium amine chloride at ph 9 in 5 molar ammonium chloride with intermittent ultrasonic agitation until 80% of the desired dendrite height is reached. U.S. Pat. No. 5,188,073. The dendrites are then overplated by palladium under the first conditions to provide mechanical strength to the dendrites. It is preferred that the dendrites 16 are about 2 mil in height. If desired, each of the dendrites 16 can be coated with a metal that could interface with or diffuse to form a metallic bond. For instance, the dendrites 16 can be coated with pure gold or with tin.

The photoresist is then removed by stripping in a suitable solvent such as propylene carbonate.

Next, a layer of curable dielectric resist 18 is applied across the upper surface of substrate 12. The resist 18 thus covers the substrate 12, the first surface metal 14 and the lower portion of the dendrites 16. In the preferred embodiment of the invention, the dendrites 16 typically would extend beyond the top of the layer of resist 18. The amount of protrusion in the preferred embodiment of the invention is approximately 0.1 to 0.5 mils.

The dielectric resist 18 may be any type of dielectric material from standard liquid epoxy, polyimide, Teflon, cyanate resins, powdered resin materials, or filled resin systems exhibiting enhanced dielectric constants. Coating of the dielectric material is performed with any number of methods known in the industry such as roller, draw, powder or curtain coating, electrostatic or electrophoretic deposition, screen printing, spraying, dipping or transfer of a dry film. Any of these coating methods is capable of providing uniformly thin films. In the preferred embodiment of the invention, the dielectric is Morton LB 404 applied by vacuum lamination. The ASM is applied to a thickness of about 2.5 mil.

A second surface metal 20, forming a second conductive layer then is applied on top of the layer of dendrites 16 and dielectric resist 18. The top of the layer of dendrites 16 is inherently substantially planar. For this reason the second surface metal 20 easily is applied. There is no need to provide for pre-drilled holes in the second conductor layer or in the dielectric to accommodate the dendrites 16. Any technique known in the art such as sputtering, plating, or laminating may be used to attach the second surface metal 20. The second surface metal 20 may be made of copper or copper over nickel or chrome. In the preferred embodiment of the invention, the second surface metal 20 is a copper foil that is 0.3 to 2 mils thick.

After application of the second surface metal 20, the dielectric resist 18 is fully cured by baking at the appropriate temperature and time. In the case of Morton LB 404, 2 hours at 200° C. is a typical cure bake.

The second surface metal 20 then can be circuitized such as by etching through photoresist to result in circuits (not shown) on the upper surface of the second surface metal 20.

The entire process can be repeated to create more layers interconnected by dendrites as described above.

The advantages of the dendrites 16 shown in FIG. 1 are two-fold. First, since even after coating with dielectric 18 the dendrites 16 form an inherently planar surface, no planarization step is needed in the manufacturing process prior to applying the second surface metal 20. Second, the dendrites 16 provide an electrical connection between the first surface metal 14 and the second surface metal 20 without the need for plated through holes or plated vias.

Figure 2:
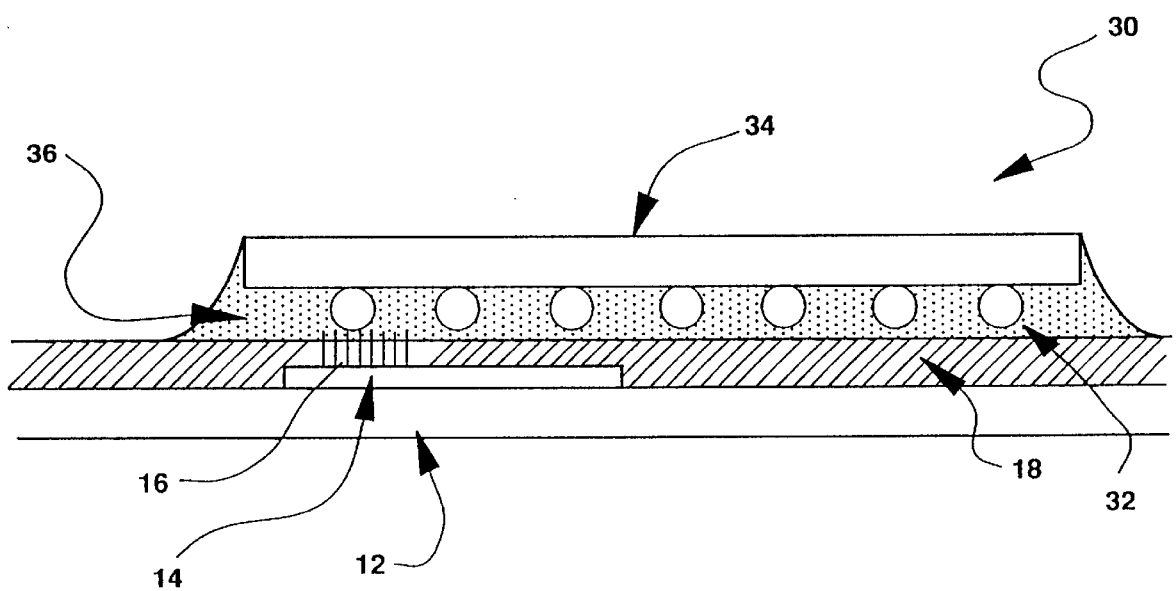
FIG. 2 is a depiction of a second alternative embodiment of a single layer of a multi-layer electronic circuit package showing direct connect of a chip to a substrate by means of a solder ball array and dendrite pads in accordance with the present invention.

FIG. 2 shows an alternative embodiment of the invention. FIG. 2 shows a single layer 30 of a multi-layer circuit board. In FIG. 2, the substrate 12, first surface metal 14, dendrites 16, and dielectric layer 18 are as in FIG. 1. The second conductive layer in FIG. 2, however, is an array 32 of chip bumps, preferably C4 solder bails. Alternatively, the array 32 may be a ball grid array. The connecting bumps can also be of gold, nickel or a suitable conductive adhesive.

The use of spherical shaped balls or bumps in electronic modules is well-known in the art. With the increase in the number of input/output leads extending from electronic devices, such as integrated circuits, ball grid array (BGA) packages have been developed. A BGA package is a type of packaged electronic device in which at least one electronic device, such as an integrated circuit chip, is mounted to a substrate and an electrical connection to an electrically conductive material not part of the packaged electronic device, such as a printed circuit board (PCB), is made by an array of solder balls located on a surface of the substrate.

As shown in FIG. 2, a chip 34 can be electrically connected to the first surface metal 14 by means of the array 32 and the dendrites 16. The connection between the chip 34 and the first surface metal 14 can be by mechanical force. Alternatively, the area under the chip 34 can be filled with an organic curable adhesive 36. When the adhesive cures, the mechanical force then can be removed. A suitable adhesive 36 is an epoxy or a cyanate ester filled with ceramic particles. The preferred underfill material is Dexter FP 4511. The use of underfill materials to stabilize C4 and BGA connections is well known.

Alternately, a chip having gold stud bumps may be thermosonically bonded directly to palladium dendrites having a gold flash layer, thereby further stabilizing the electrical chip interconnection. This enhancement permits underfill dispense and cure without an applied mechanical force.

A second option for achieving a metallurgical chip interconnection comprises the use of a tin coated C4 solder bump which can be soldered directly to the palladium dendrites. This option also permits underfill dispense and cure without an applied mechanical force.

The arrangement shown in FIG. 2 has several advantages. A first advantage is that no solder mask is required to define the connection pads, thus eliminating the photolithographic process and associated registration concerns. A second advantage is that the connection is made by small forces eliminating the need for solder reflow and avoiding concomitant thermal stresses. A third advantage is that the chip is reworkable with an appropriate reworkable adhesive.

Figure 3:
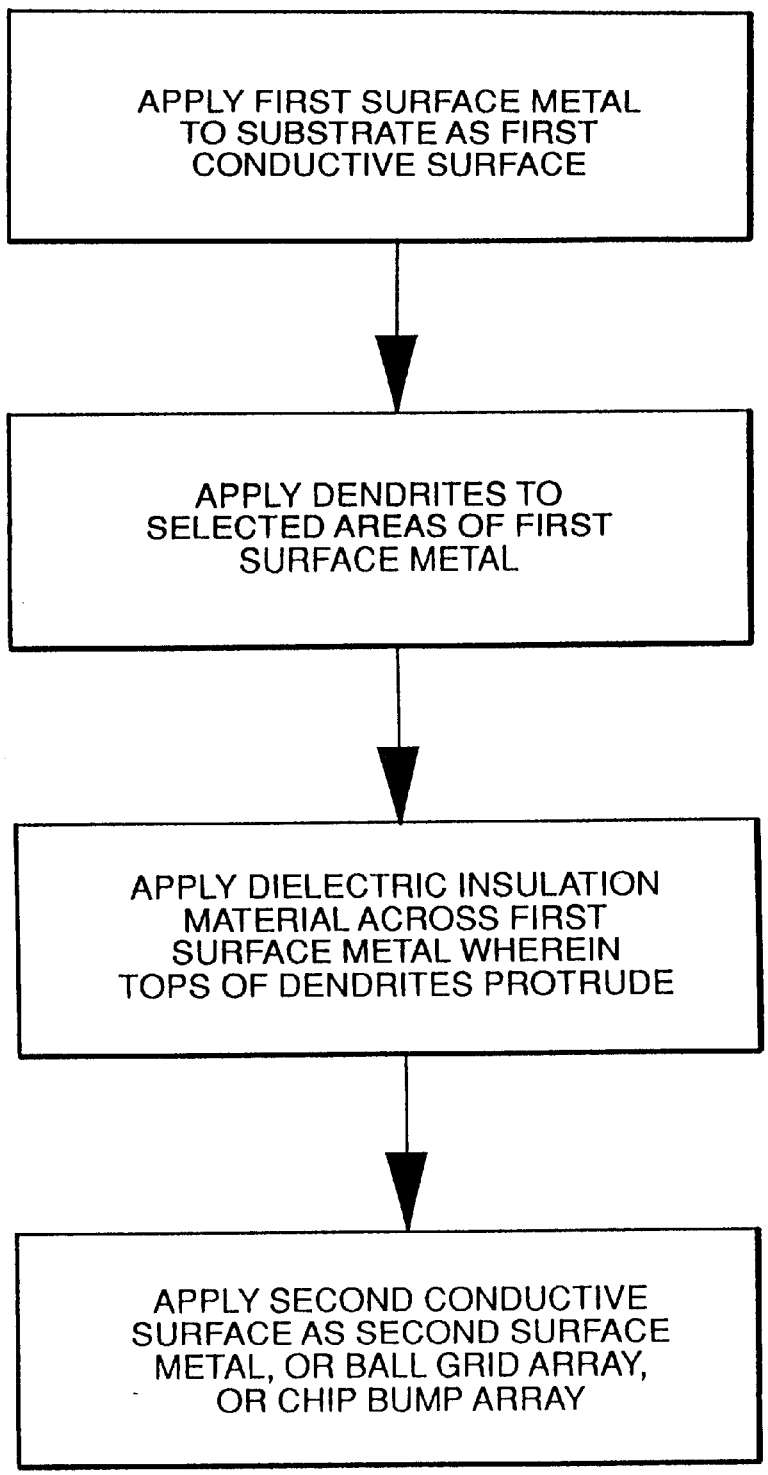
FIG. 3 is a flow chart of the method of the present invention.

FIG. 3 is a flow chart in accordance with the method of the present invention.

Although specific embodiments have been described herein for purposes of illustration, various modifications may be made without departing from the spirit or scope of the invention.

What is claimed is:

1. A method for electrically connecting two conductive surfaces in an electronic circuit package comprising the sequential steps of:
   applying to a substrate a first surface metal forming a first conductive surface;
   applying dendrites to at least one selected area of the first surface metal;
   applying a dielectric insulation material to cover the first surface metal wherein the dendrites protrude above the top of the dielectric insulation material; and
   applying a second conductive surface on top of the dendrites.

2. The method of claim 1, wherein the first surface metal is made of a copper material.

3. The method of claim 1, wherein the substrate is made of an organic material.

4. The method of claim 3, wherein the organic material is a glass reinforced epoxy.

5. The method of claim 1, wherein the step of applying dendrites further comprises:
   applying a photoresist material to the area of the first surface metal;
   exposing and developing the photoresist material;
   applying a layer of nickel to the first surface metal;
   applying a layer of palladium over the layer of nickel;
   forming the lower dendrites on the palladium layer by ultrasonic plating of palladium; and
   removing the photoresist material.

6. The method of claim 1, wherein the dendrites are formed to a height of approximately 2 mils.

7. The method of claim 1, wherein the dendrites are made of palladium material.

8. The method of claim 1, wherein the dendrites protrude approximately 0.1–0.5 mil. above the top of the dielectric insulation material.

9. The method of claim 1, wherein the dielectric insulation material is an epoxy based dielectric.

10. The method of claim 1, wherein the dielectric insulation material is applied by vacuum lamination.

11. The method of claim 1, wherein the second conductive surface is a second surface metal.

12. The method of claim 11, wherein the second surface metal is circuitized.

13. The method of claim 11, wherein the second surface metal is made of a copper material.

14. The method of claim 1, wherein the second conductive surface is a C4 solder ball array.

15. The method of claim 14, further comprising the step of directly connecting a chip to the array.

16. The method of claim 15, wherein the chip is directly connected by mechanical force.

17. The method of claim 15, further comprising the step of filling the area under the chip with an organic curable encapsulant.

18. The method of claim 17, wherein the encapsulant is a filled epoxy based encapsulant.

19. The method of claim 1, wherein the second conductive surface is a ball grid array.

20. The method of claim 19, further comprising the step of directly connecting a chip to the array.

21. The method of claim 20, wherein the chip is directly connected by mechanical force.

22. The method of claim 20, further comprising the step of filling the area under the chip with an organic curable encapsulant.

23. The method of claim 22, wherein the encapsulant is a filled epoxy based or cyanate ester encapsulant.

24. The method of claim 1, wherein the second conductive surface is a gold bump array.

25. The method of claim 24, further comprising the step of directly connecting a chip to the array.

26. The method of claim 25, wherein the chip is directly connected by thermosonic bonding.

27. The method of claim 1, wherein the second conductive surface is a tin coated C4 solder bump array.

28. The method of claim 27, further comprising the step of directly connecting a chip to the array.

29. The method of claim 28, wherein the chip is directly connected by soldering.

* * * * *